United States Patent [19]
Totsuka

[11] Patent Number: 5,267,526
[45] Date of Patent: Dec. 7, 1993

[54] CROSS-COIL TYPE INDICATOR

[75] Inventor: Shigeki Totsuka, Shimada, Japan

[73] Assignee: Yazaki Corporation, Tokyo, Japan

[21] Appl. No.: 780,939

[22] Filed: Oct. 23, 1991

[30] Foreign Application Priority Data

Nov. 9, 1990 [JP] Japan .................. 2-117156[U]

[51] Int. Cl.⁵ .............................. G01D 11/16
[52] U.S. Cl. .................. 116/291; 116/294; 116/305; 324/146
[58] Field of Search .......... 116/284, 291, 294, 297, 116/305, 62.4; 324/143, 144, 146, 151 A, 154 R, 154 PB, 156

[56] References Cited

U.S. PATENT DOCUMENTS

| | | | |
|---|---|---|---|
| 2,500,628 | 3/1950 | Clark | 324/146 |
| 2,714,000 | 7/1955 | O'Connor et al. | 324/154 R |
| 3,753,107 | 8/1973 | Burgett et al. | 324/154 R X |
| 4,646,007 | 2/1987 | Faria | 116/297 X |
| 4,906,919 | 3/1990 | Sato et al. | 324/143 X |
| 5,017,862 | 5/1991 | Brooks | 324/154 R X |
| 5,061,891 | 10/1991 | Totsuka et al. | 324/146 |
| 5,061,893 | 10/1991 | Gutmann | 324/154 PB |
| 5,062,135 | 10/1991 | Ohike | 116/297 X |
| 5,095,266 | 3/1992 | Ohike et al. | 324/146 |
| 5,138,968 | 8/1992 | Ohike | 116/294 |
| 5,146,158 | 9/1992 | Ooike | 324/154 R X |

FOREIGN PATENT DOCUMENTS 2902822 7/1980 Fed. Rep. of Germany ...... 116/294
2925533 1/1981 Fed. Rep. of Germany ... 324/154 R

*Primary Examiner*—William A. Cuchlinski, Jr.
*Assistant Examiner*—John L. Beres
*Attorney, Agent, or Firm*—Sughrue, Mion, Zinn, Macpeak & Seas

[57] ABSTRACT

A cross-coil type indicator including a coil bobbin around which a pair of coils are wound while intersecting each other at a right angle, a magnet rotor rotatably supported in a hollow space of the coil bobbin, a pointer shaft fixedly secured to a center portion of the magnet rotor, a pointer firmly fitted onto the pointer shaft, and a dial plate having a graduation arranged thereon to indicate the present quantity of measurement in cooperation with the pointer. In the indicator, a projection is provided on an upper surface of the magnet rotor and a recess is provided on an inner wall surface of the coil bobbin located opposite to the upper surface of the magnet rotor, so that the projection and the recess are engaged with each other while the pointer shaft is moved upward. The projection may be provided on the inner wall surface of the coil bobbin. In this case, the recess is provided on the upper surface of the magnet rotor.

9 Claims, 5 Drawing Sheets

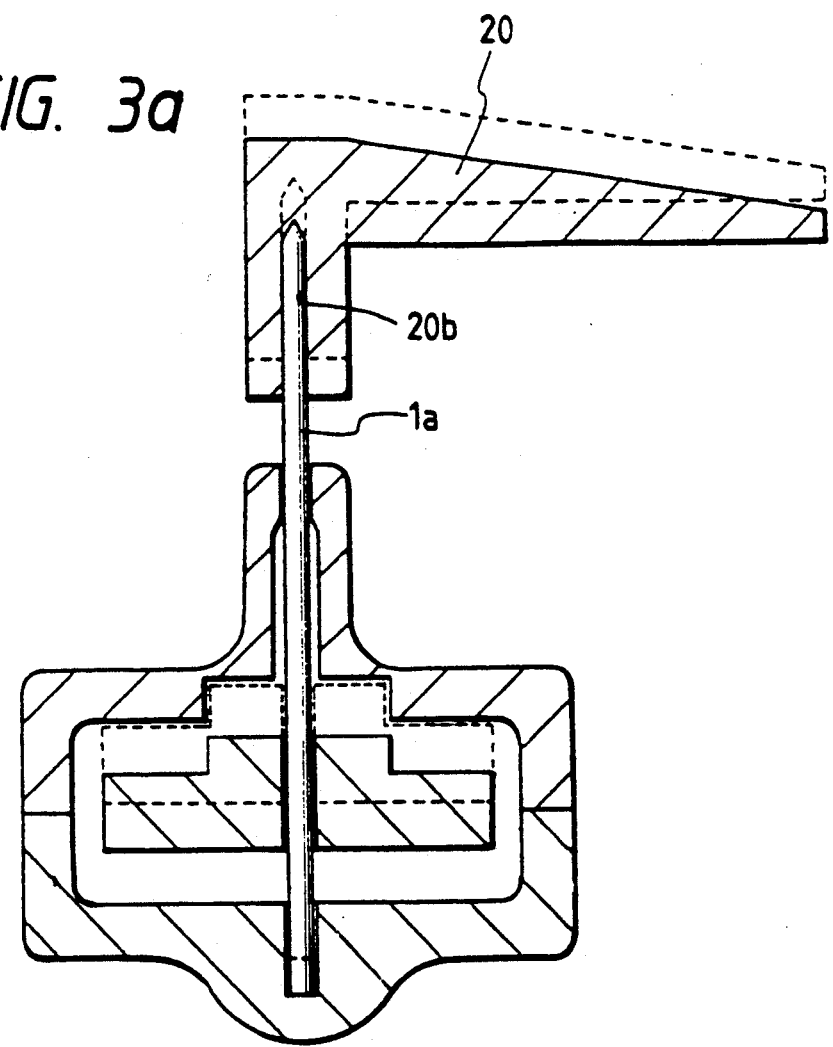
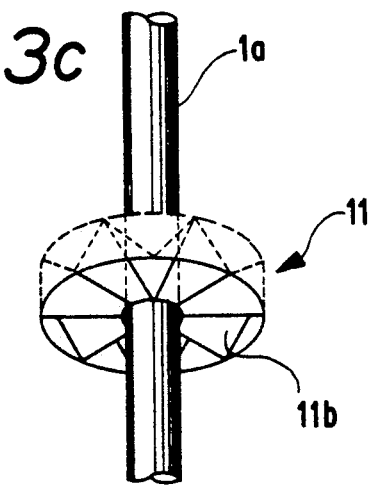

CROSS-COIL TYPE INDICATOR

BACKGROUND OF THE INVENTION

1. Field of the Invention

The present invention relates to a cross-coil type indicator. More particularly, the present invention relates to an improvement of the cross-coil type indicator preferably employable for an instrument of the type to be installed on an automotive vehicle, e.g., a speed meter, a rotation meter, a boost meter or the like wherein the indicator includes a movement for rotationally driving a pointer shaft corresponding to a quantity of measurement, a pointer firmly supported by fitting the foremost end part of the pointer shaft into a press-fit hole of the pointer, and a dial plate having a series of calibrations arranged thereon to indicate the present quantity of measurement in cooperation with the pointer.

2. Description of the Related Art

To facilitate understanding of the present invention, a conventional typical cross-coil type indicator will be described below with reference to FIG. 4.

FIG. 4 is a vertical sectional view of the conventional cross-coil type indicator. This indicator is constructed in such a manner that a pair of coils adapted to generate magnetic fields intersecting each other at a right angle are fed with an electric current of which intensity varies corresponding to a quantity of measurement so that a magnet rotor is rotated in the direction of a composite magnetic field derived from combination of the magnetic fields generated by the pair of coils so as to indicate the quantity of measurement in cooperation of a pointer adapted to be rotated by the magnet rotor with the aid of a graduation or scale arranged on a dial plate.

In detail, as shown in FIG. 4, a movement 1 for rotationally driving a pointer shaft 1a corresponding to a quantity of measurement includes a coil bobbin 11, and two coils 12 are arranged around the outer periphery of the coil bobbin 11 in the overlapped state such that they intersect each other at a right angle. A disc-shaped magnet rotor 13 including a south pole and a north pole is rotatably supported in a hollow space 11a of the coil bobbin 11, and a pointer shaft 1a made of a metallic material is fixedly secured to the magnet rotor 13 while extending through the central part of the rotor. The pointer shaft 1a is rotatably supported in the coil bobbin 11 such that its one end, i.e., the upper end of the pointer shaft 1a as seen in the drawing is upwardly projected outside of the coil bobbin 11. As the coils 12 are turned on, the magnet rotor 13 is rotationally driven together with the pointer shaft 1a by a predetermined angle.

A collar 15 for a spiral leaf spring 16 is immovably fitted onto the pointer shaft 1a in such a manner that the inner end of the spiral leaf spring 16 is fixed to the collar 15 and the outer end of the spring is fixed to the coil bobbin 11. While the coils 12 are turned off and the magnet rotor 13 is not rotationally driven, the spiral leaf spring 16 serves to return the pointer shaft 1a to a predetermined zero position with its resilient force.

A dial plate 18 is fixedly mounted on the movement 1 by set screws 19, and the foremost end part of the pointer shaft 1a is projected upward of the dial plate 18 so that a pointer 20 molded of a synthetic resin material is press-fitted onto the pointer shaft 1a. It should be noted that the foremost end part of the pointer shaft 1a is slightly tapered so as to enable it to be easily fitted into a press-fit hole 20b formed in a boss 20a of the pointer 20.

In addition, a movement case 21 is arranged outside of the coil bobbin 11 so as to shut the inner and outer magnetic fields.

With the indicator as constructed in the above-described manner, when the pointer 20 is to be fixed fitted onto the foremost end of the pointer shaft 1a, first, the pointer 20 is provisionally fitted to the foremost end of the pointer shaft 1a. While the foregoing state is maintained, each of the coils 12 is then fed with an electric current of which intensity corresponds to a predetermined quantity of measurement. For example, in a case where the indicator is used as a speed meter, each coil 12 is fed with an electric current of which intensity corresponds to a speed of, e.g., 40 km/hr. While the coils 12 are turned on, the position of the pointer 20 is properly adjusted such that the pointer 20 which has been provisionally fitted onto the pointer shaft 1a assumes an indication position on the dial plate 18 corresponding to the foregoing speed of 40 km/hr. Subsequently, while the foregoing position is maintained, the foremost end of the pointer shaft 1a is forcibly inserted into the press-fit hole 20b by depressing the pointer 20, whereby the pointer 20 is fixedly held at an adequate position.

When the coils 12 are fed with a predetermined intensity of electric current in response to a signal derived from measurement of a vehicle speed or the like, the magnet rotor 13 is rotated by an angle corresponding to a quantity of measurement under the influence of the composite magnetic field induced by the coils 12, causing the pointer 20 to be rotated to a predetermined position on the dial plate 18 via rotation of the pointer shaft 1a. As a result, the present quantity of measurement is visually recognized by reading the graduation on the dial plate 18.

When the coils 12 are turned off, the magnet rotor 13 is rotationally returned to the zero position by the resilient force of the spiral leaf spring 16.

However, with respect to the conventional indicator constructed in the above-described manner, since the foremost end of the pointer shaft 1a is forcibly inserted into the press-fit hole 20b of the pointer 20 by depressing the pointer 20 after the indication position of the pointer 20 to be assumed on the dial plate 18 is visually recognized while the coils 12 are fed with an electric current of which intensity corresponds to a predetermined quantity of measurement, there arises a malfunction that a small amount of relative rotation is caused between the pointer shaft 1a and the pointer 20 due to slight injury on the outer surface of the pointer shaft 1a or the inner wall surface of the press-fit hole 20b of the pointer 20 or due to slight deformation of the press-fit hole 20b of the pointer 20

Once such a malfunction as mentioned above has arisen, the pointer 20 is fixedly fitted onto the pointer shaft 1a at a position deviated from the predetermined indication position, and there appears a problem that indication properties of the pointer 20 are degraded, resulting in incorrect indication of the present quantity of measurement.

SUMMARY OF THE INVENTION

The present invention has been made with the foregoing background in mind.

An object of the present invention is to provide a cross-coil type indicator which assures that positional deviation of a pointer from a predetermined position can be corrected so that the pointer can firmly be fitted onto a pointer shaft at an adequate position relative to the pointer shaft.

To accomplish the above object, a cross-coil type indicator according to the present invention comprises: a coil bobbin around which a pair of coils are wound while intersecting each other, and of which inner and upper wall surface of hollow space is provided with first engagement means; a magnet rotor rotatably supported in the hollow space of the coil bobbin, and of which upper surface opposite to the inner and upper wall surface of the hollow space is provided with second engagement means; a pointer shaft fixedly secured to a center portion of the magnet rotor, the pointer shaft being rotationally driven by feeding electric currents to the coils corresponding to a quantity of measurement; a pointer firmly fitted onto the pointer shaft by forcibly inserting a foremost end part of the pointer shaft into a press-fit hole formed on the pointer; and a dial plate having a graduation arranged thereon to indicate the quantity of measurement in cooperation with the pointer, wherein the first engagement means and the second engagement means are engaged with each other while the pointer shaft is moved upward.

Other objects, features and advantages of the present invention will readily become apparent from reading of the following description which has been made in conjunction with the accompanying drawings.

BRIEF DESCRIPTION OF THE DRAWINGS

The present invention is illustrated in the following drawings in which:

FIG. 3a is a sectional view and FIGS. 3b and 3c are perspective views of a cross-coil type indicator according to a second embodiment of the present invention, particularly illustrating the structure of a magnet rotor;

DETAILED DESCRIPTION OF THE PREFERRED EMBODIMENTS

Figure 4:
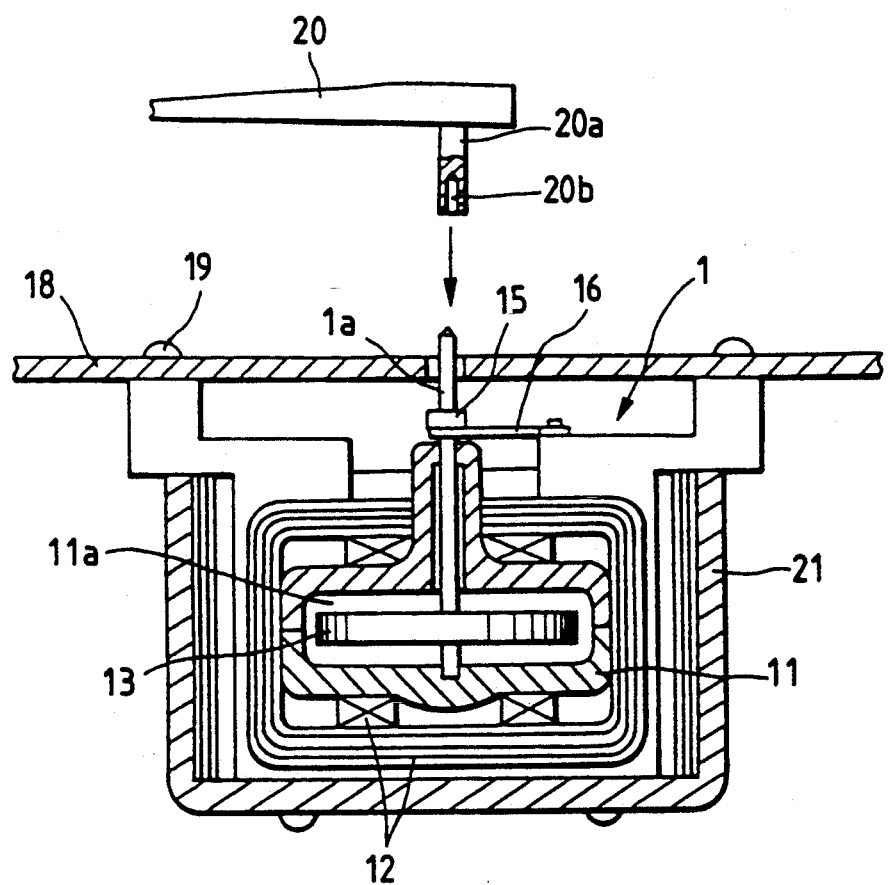
FIG. 4 is a vertical sectional view of a conventional cross-coil type indicator.

Now, the present invention will be described in detail hereinafter with reference to the accompanying drawings which illustrate preferred embodiments of the present invention. It should be noted that the same or similar components to those constituting the conventional cross-coil type indicator which has been described above with reference to FIG. 4 are designated by the same reference numerals.

Figure 1:
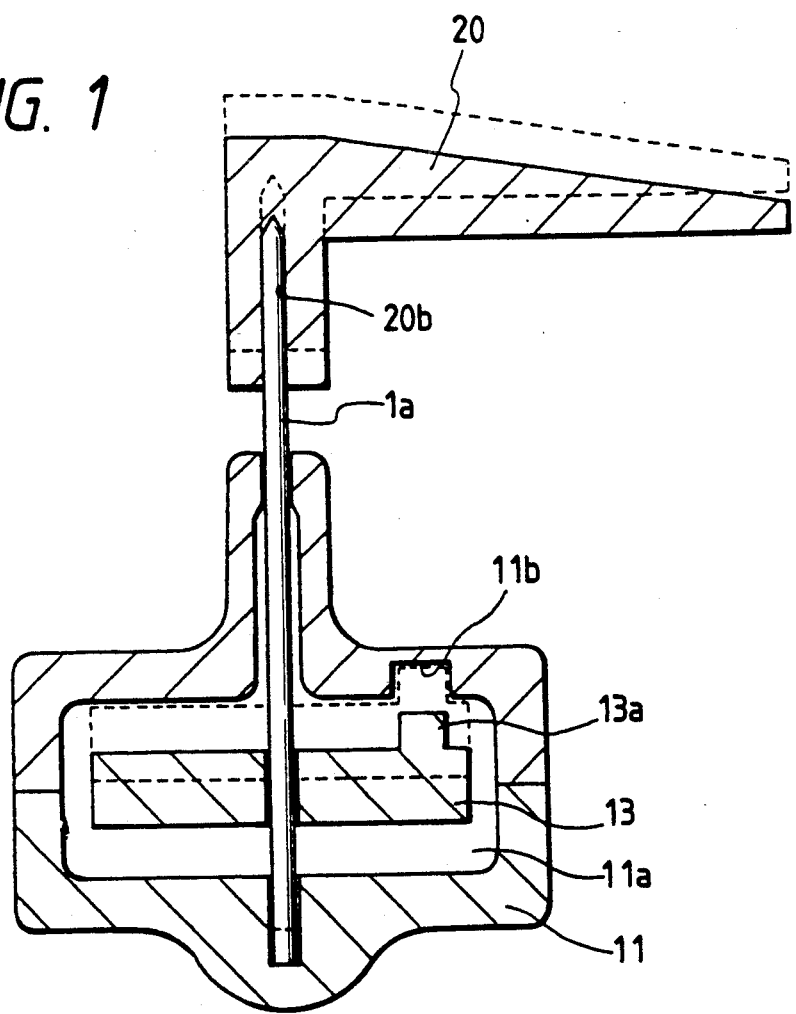
FIG. 1 is a vertical sectional view of a cross-coil type indicator according to a first embodiment of the present invention, particularly illustrating the structure of a magnet rotor and associated components.
Figure 2:
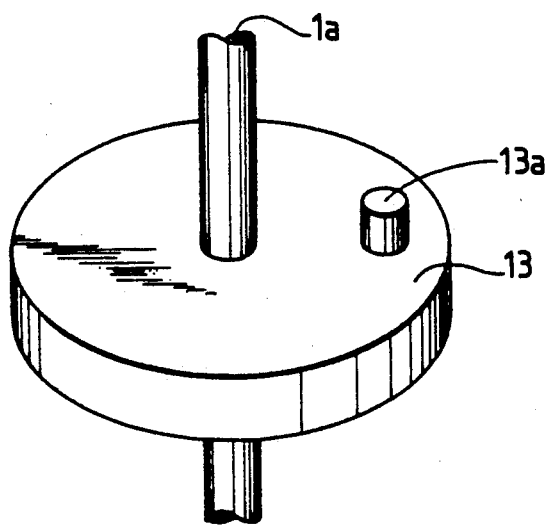
FIG. 2 is a perspective view of the magnet rotor in the cross-coil type indicator shown in FIG. 1.

FIG. 1 and FIG. 2 illustrate a cross-coil type indicator according to a first embodiment of the present invention. As is apparent from the drawings, a cylindrical projection 13a is formed on the upper surface of a circular disc-shaped magnet rotor 13 at a position in the proximity of the outer peripheral edge of the rotor. The magnet rotor 13 is rotatably supported in a hollow space 11a of a coil bobbin 11. In addition, a cylindrical recess 11b to be engaged with the cylindrical projection 13a on the magnet rotor 13 is formed on the upper inner wall surface of the coil bobbin 11 located opposite to the upper surface of the magnet rotor 13.

Next, an operation of the cross-coil type indicator as constructed in the aforementioned manner will be described below.

When a pointer 20 is fixedly fitted onto a pointer shaft 1a at a position deviated from a predetermined indication position while the foremost end part of the pointer shaft 1a is inserted into a press-fit hole 20b formed on the pointer 20, the pointer shaft 1a is pulled up while holding the pointer 20 in order to correct the foregoing position deviation. This causes the cylindrical projection 13a to be brought in engagement with the cylindrical recess 11b of the coil bobbin 11. As long as the foregoing state is maintained, the pointer shaft 1a can not usually be rotated. However, the pointer 20 can be rotated relative to the pointer shaft 1a by forcibly rotating the pointer 20 against the press-fit force generated when the pointer 20 is fitted onto the pointer shaft 1a. Consequently, the positional deviation is corrected by rotating the pointer 20 by an angular quantity corresponding to the positional deviation in such a direction that the positional deviation is eliminated.

FIG. 3 is a perspective view of a cross-coil type indicator according to a second embodiment of the present invention, particularly showing the structure of a magnet rotor. It should be noted that the cross-coil type indicator according to the second embodiment of the present invention is substantially the same as the cross-coil type indicator according to the first embodiment of the present invention in structure with the exception of the following points.

Figure 3B:
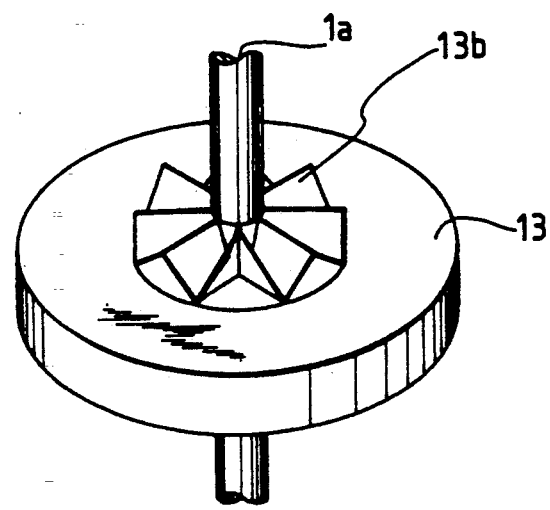
Figure 6A:
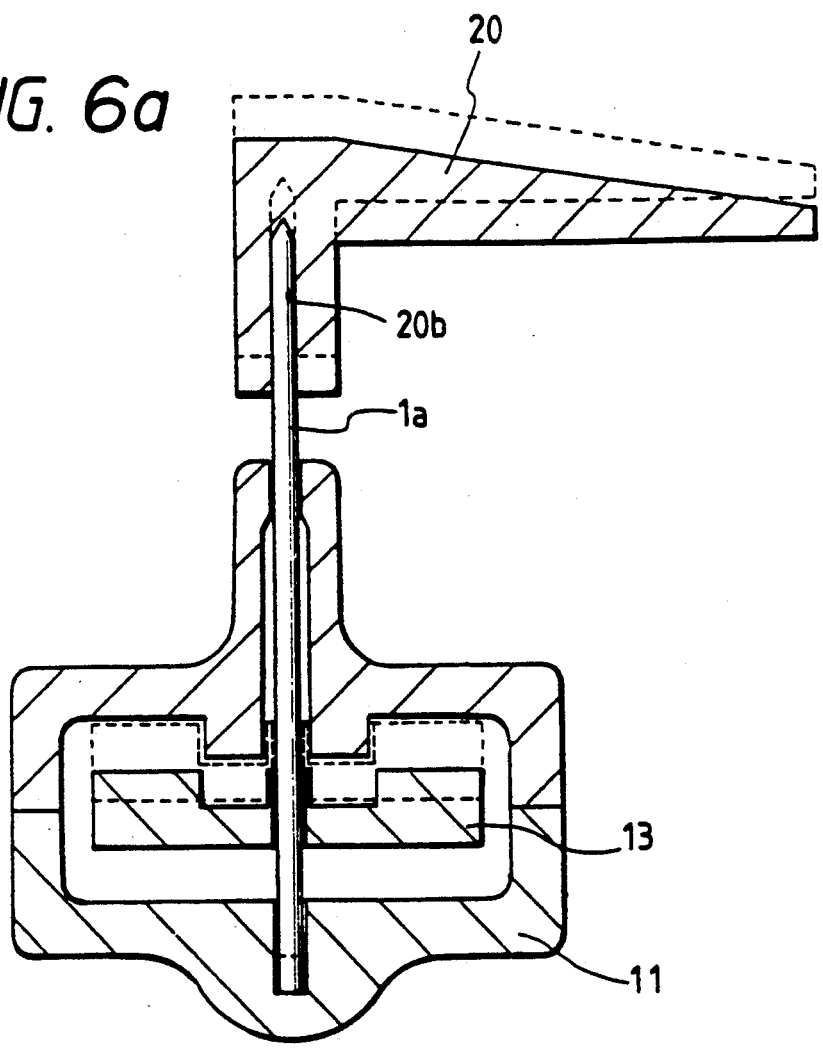
FIG. 6a is a sectional view and FIGS. 6b and 6c are perspective views of a cross-coil type indicator according to yet another embodiment of the invention.
Figure 6B:
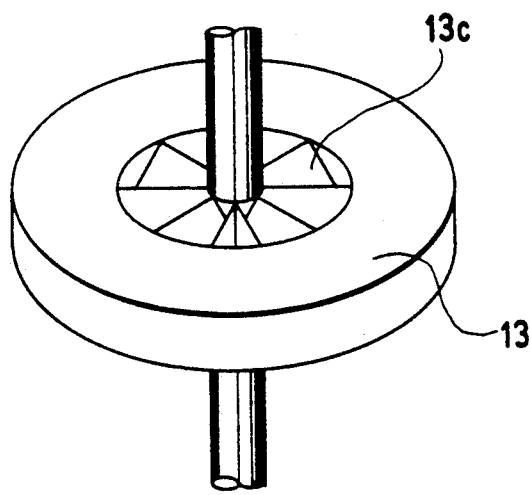
Figure 6C:
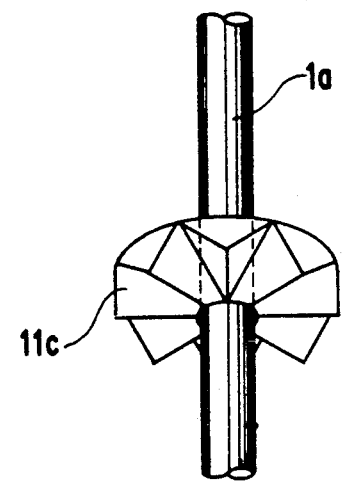

Specifically, as shown in FIGS. 3a-3c a plurality of radially extending projections 13b each having a triangular sectional contour are integrally arranged on the upper surface of a magnet rotor 13 in the equally spaced relationship in the circumferential direction in the peripheral region around a pointer shaft 1a. On the other hand, a plurality of radially extending recesses 11b each having a triangular sectional contour to be engaged with the projections 13b are formed on the inner upper surface of the coil bobbin 11 in the peripheral region around a bearing hole of the pointer shaft 1a. Alternatively, the triangular projections 11c may be provided on the coil bobbin 11 and the triangular recesses 13c, provided in the rotor 13, as shown in FIGS. 6a, 6b and 6c. Obviously the magnet rotor 13 is rotatably supported in the coil bobbin 11, and the inner upper surface of the coil bobbin 11 having the recesses 11b formed thereon is located opposite to the upper surface of the magnet rotor 13. Of course, it is understood that the radially extending projections cold have a convex shape and that the recesses 11b could have a concave shape.

With this construction, the positional deviation of the pointer 20 can be corrected in the same manner as the first embodiment of the present invention. Since the operation of the cross-coil type indicator according to the second embodiment of the present invention is the same as that in the first embodiment of the present invention, repeated description will not be required.

Figure 5A:
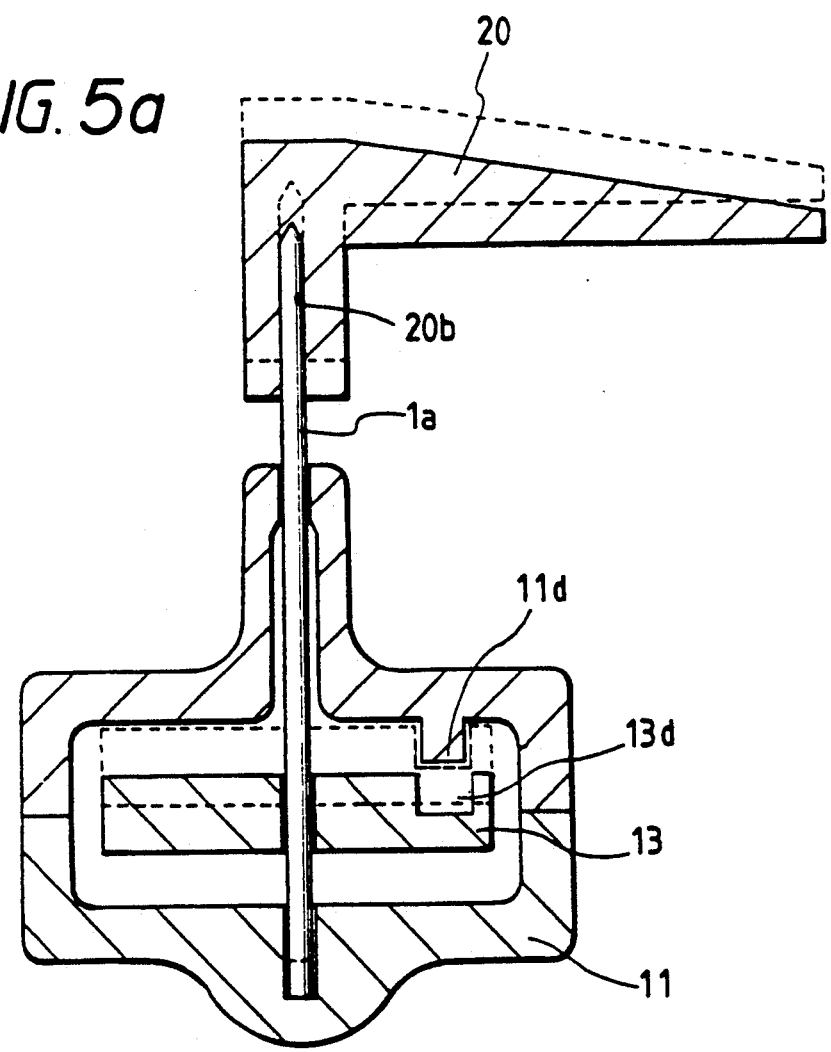
FIGS. 5a and 5b are sectional and perspective views o a cross-coil type indicator according to yet another embodiment of the invention.
Figure 5B:
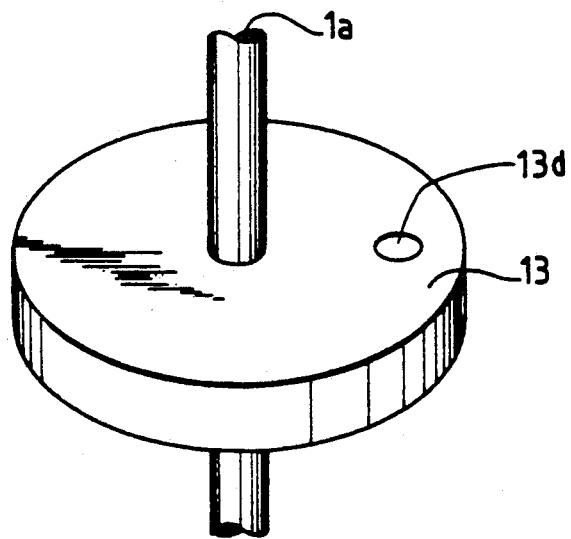

The present invention has been described above with respect to two preferred embodiments thereof wherein a projection or projections are formed on the magnet rotor 13 side and a recess or recesses to be engaged with the projection or projections are formed on the coil bobbin 11 side. However, the present invention should not be limited only to these embodiments but various changes or modifications may be made without departure from the scope of the present invention defined by the appended claims. For example, modification may be made such that a projection 11d or projections are formed on the coil bobbin 11 side and a recess 13d or recesses to be engaged with the projection or projections are formed on the magnet rotor 13 side. As shown in FIGS. 5a and 5b. Alternatively a significant feature of the present invention consists in that engagement portions to come in engagement with each other when the pointer shaft 1a is pulled up are formed on the upper surface of the magnet rotor 13 as well as the inner upper surface of the coil bobbin 11 located opposite to the upper surface of the magnet rotor 13 in the hollow space 11a of the coil bobbin 11.

As is apparent from the above description, according to the present invention, in a case where a pointer has failed to be exactly fitted onto a pointer shaft due to the positional deviation caused when the foremost end part of the pointer shaft is forcibly inserted into a press-fit hole of the pointer, the positional deviation of the pointer can properly be corrected by pulling up the pointer shaft thereby to bring the both engagement portions in engagement with each other. Thus, the pointer can immovably be mounted at a proper position relative to the pointer shaft on the cross-coil type indicator. Consequently, the cross-coil type indicator can indicate a quantity of measurement with excellent accuracy while maintaining exact indication properties at all times.

What is claimed is:

1. A cross-coil type indicator comprising:
   a coil bobbin around which a pair of coils are wound while intersecting each other at a right angle, said coil bobbin having a hollow space partially defined by an interior, upper wall surface which is provided with first engagement means;
   a magnet rotor rotatably supported in the hollow space of said coil bobbin, an upper surface of said rotor, facing said interior upper wall surface, being provided with second engagement means;
   a pointer shaft fixedly secured to a center portion of said magnet rotor, said pointer shaft being rotationally driven by feeding electric currents to said coils corresponding to a quantity of measurement;
   a pointer firmly fitted onto said pointer shaft by forcibly inserting a foremost end part of said pointer shaft into a press-fit hole formed on said pointer; and
   a dial plate having a graduation arranged thereon to indicate said quantity of measurement in cooperation with said pointer, wherein said first engagement means and said second engagement means are engaged with each other upon upward movement of said pointer shaft and cooperate to prevent relative rotation between said coil bobbin and said rotor to allow said pointer to be rotated on said pointer shaft to a proper position.

2. The indicator according to claim 1, wherein said first engagement means includes a cylindrical recess and said second engagement means includes a cylindrical projection.

3. The indicator according to claim 1, wherein said first engagement means includes a plurality of radially extending recesses each having a triangular sectional contour and said second engagement means includes a plurality of radially extending projections each having a triangular sectional contour.

4. The indicator according to claim 1, wherein said first engagement means includes a cylindrical projection and said second engagement means includes a cylindrical recess.

5. The indicator according to claim 1, wherein said first engagement means includes a plurality of radially extending projections each having a triangular sectional contour and said second engagement means includes a plurality of radially extending recesses each having a triangular sectional contour.

6. The indicator according to claim 1, wherein the foremost end part of said pointer shaft is slightly tapered.

7. The indicator according to claim 1, wherein said pointer shaft is formed of a metallic material and said pointer is formed of a synthetic resin material.

8. The indicator according to claim 1, further comprising a collar immovably fitted onto said pointer shaft, and a spiral leaf spring of which inner end is fixed to said collar and outer end is fixed to said coil bobbin, wherein said spiral leaf spring serves to return said pointer shaft to a predetermined zero position while said coils are not fed with the electric currents and said magnet rotor is not rotationally driven.

9. A cross-coil type indicator, comprising:
   a coil bobbin around which a pair of coils are wound while intersecting each other at a right angle, said coil bobbin having a hollow space defined therein;
   a magnetic rotor rotatably supported in the hollow space of said coil bobbin;
   a pointer shaft fixedly secured to a center portion of said magnetic rotor, said pointer shaft being rotationally driven b feeding electric currents to said coils corresponding to a quantity of measurements;
   a pointer firmly fitted onto said pointer shaft by forcibly inserting a foremost end part of said pointer shaft into a press-fit hole formed on said pointer
   a dial plate having a graduation thereon to indicate said quantity of measurement in cooperation with said pointer; and
   means for preventing relative rotation between said coil bobbin and said rotor by moving said pointer shaft upwardly so as to allow said pointer to be properly rotatably oriented with respect to said pointer shaft.

* * * * *